United States Patent
Shinohara et al.

(10) Patent No.: US 8,835,269 B2
(45) Date of Patent: Sep. 16, 2014

(54) METHOD OF MANUFACTURING SOLID-STATE IMAGE SENSOR

(75) Inventors: Mahito Shinohara, Tokyo (JP); Junji Iwata, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 27 days.

(21) Appl. No.: 13/607,107

(22) Filed: Sep. 7, 2012

(65) Prior Publication Data

US 2013/0089945 A1    Apr. 11, 2013

(30) Foreign Application Priority Data

Oct. 7, 2011   (JP) .................................. 2011-223457

(51) Int. Cl.
| | |
|---|---|
| H01L 21/336 | (2006.01) |
| H01L 21/425 | (2006.01) |
| H01L 21/00 | (2006.01) |
| H01L 21/331 | (2006.01) |
| H01L 27/146 | (2006.01) |
| H01L 21/04 | (2006.01) |

(52) U.S. Cl.
CPC ..... *H01L 27/14689* (2013.01); *H01L 27/14643* (2013.01)
USPC ............. 438/302; 438/57; 438/377; 438/525; 257/E21.059

(58) Field of Classification Search
None
See application file for complete search history.

(56) References Cited

U.S. PATENT DOCUMENTS

| | | | |
|---|---|---|---|
| 6,670,990 B1 | 12/2003 | Kochi et al. | |
| 2003/0148574 A1* | 8/2003 | Thomas et al. | ............... 438/201 |
| 2005/0064613 A1* | 3/2005 | Takeuchi et al. | ................ 438/24 |

FOREIGN PATENT DOCUMENTS

| | | |
|---|---|---|
| JP | 11-196331 A | 7/1999 |
| JP | 2007-299938 A | 11/2007 |
| JP | 2008-60380 A | 3/2008 |

* cited by examiner

*Primary Examiner* — Calvin Choi
(74) *Attorney, Agent, or Firm* — Fitzpatrick, Cella, Harper and Scinto

(57) ABSTRACT

A method of manufacturing a solid-state image sensor having photoelectric conversion elements and one or more MOS transistors are formed on a semiconductor substrate is provided. The method includes forming a resist pattern having an opening and a shielding portion over the substrate; and implanting ions in the substrate through the opening. When the substrate is viewed from a direction, an isolation region that is positioned between accumulation regions adjacent to one another is exposed in the opening, and when viewed from a different direction, a channel region of the MOS transistors is exposed in the opening, and the isolation region is shielded by the shielding portion. Ions irradiated in the direction are implanted in the isolation region, and ions irradiated in the different direction are implanted in the channel region.

9 Claims, 8 Drawing Sheets

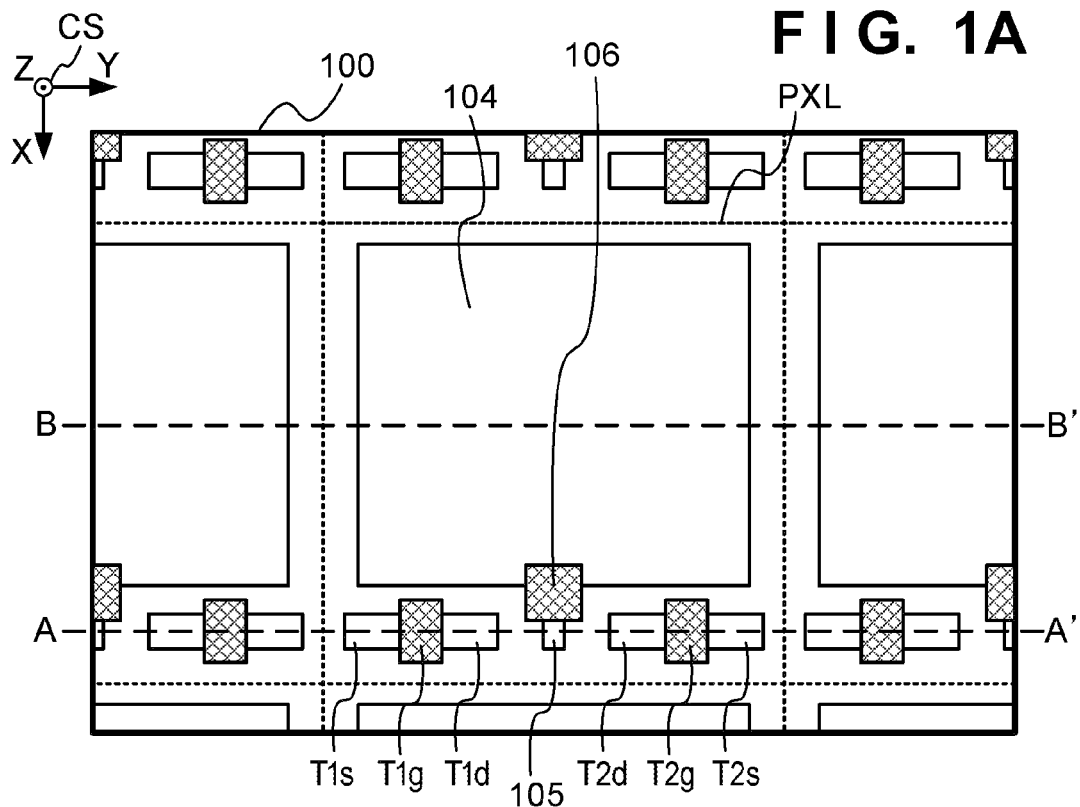
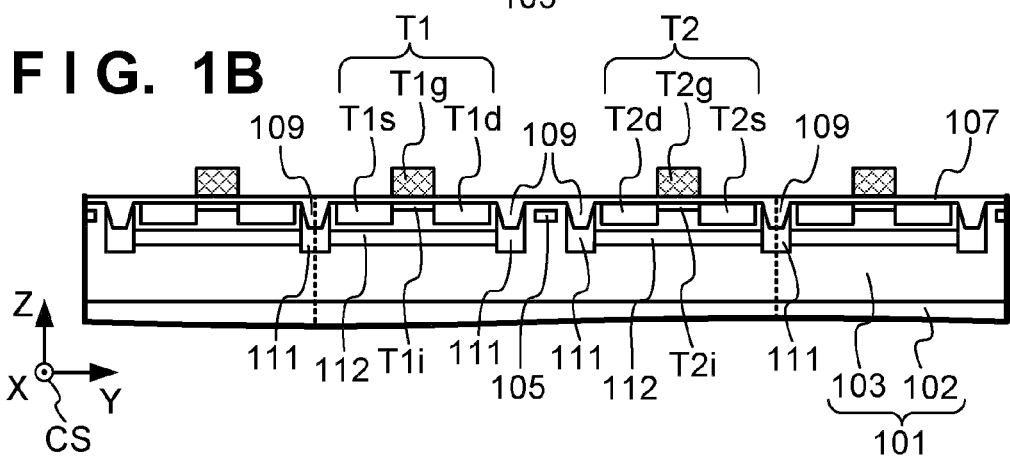
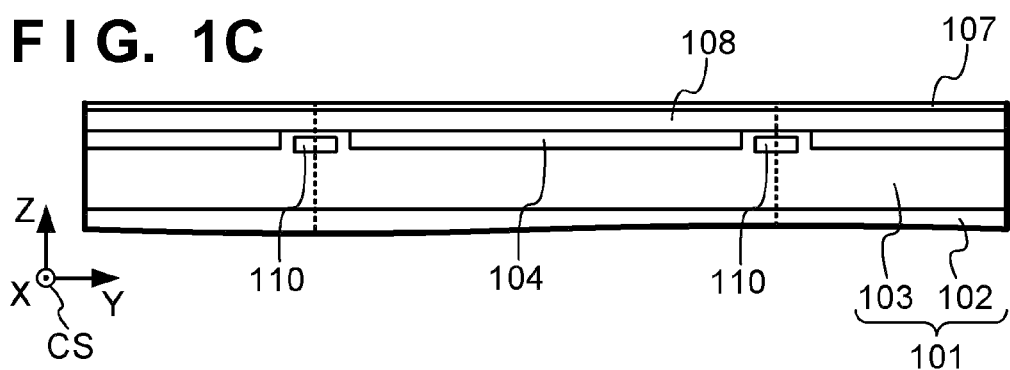

METHOD OF MANUFACTURING SOLID-STATE IMAGE SENSOR

BACKGROUND OF THE INVENTION

1. Field of the Invention

The present invention relates to a method of manufacturing a solid-state image sensor.

2. Description of the Related Art

A CMOS solid-state image sensor, which is one type of solid-state image sensor, has a plurality of MOS transistors, such as reset transistors, amplification transistors, transfer transistors, and the like, for processing charges accumulated in photoelectric conversion elements. The threshold voltage of these MOS transistors is controlled by implanting donor ions or acceptor ions into a channel region. In Japanese Patent Laid-Open 11-196331, in order to make the threshold voltages different for each MOS transistor, a step of forming a resist pattern in which openings for channel regions for the intended MOS transistor are formed and a step of implanting ions from the openings to the channel regions are performed for each MOS transistor.

SUMMARY OF THE INVENTION

As disclosed in Japanese Patent Laid-Open No. 11-196331, in order to implant ions under different conditions in a plurality of different regions in a semiconductor substrate, a resist pattern forming step and an ion implantation step must be repeated for each set of conditions. This increases the number of manufacturing steps and the manufacturing costs and time. Accordingly, an aspect of the present invention provides a technology whereby the number of steps needed to implant ions under different conditions in different regions of a semiconductor substrate is reduced.

A first aspect of the present invention provides a method of manufacturing a solid-state image sensor in which a plurality of photoelectric conversion elements, each including an accumulation region in which a charge accumulates, and one or more MOS transistors are formed on a semiconductor substrate, the method comprising: forming a resist pattern having an opening and a shielding portion over the semiconductor substrate; and implanting ions in the semiconductor substrate through the opening in the resist pattern, wherein during the step of forming, the resist pattern is formed such that when the semiconductor substrate is viewed from a first direction, an isolation region that is positioned between accumulation regions adjacent to one another is exposed in the opening, and when the semiconductor substrate is viewed from a different direction than the first direction, a channel region of the one or more of the MOS transistors is exposed in the opening, and the isolation region is shielded by the shielding portion, and during the step of implanting, ions irradiated in the first direction are implanted in the isolation region, and ions irradiated in the different direction are implanted in the channel region of the one or more MOS transistors.

A second aspect of the present invention provides a method of manufacturing a solid-state image sensor in which a plurality of photoelectric conversion elements, each including an accumulation region in which a charge accumulates, and a MOS transistor are formed on a semiconductor substrate, the method comprising: forming, over the semiconductor substrate, a resist pattern having an opening in which are exposed a first region including a channel region of the MOS transistor and a second region that is a region different from the first region and includes an isolation region positioned between accumulation region adjacent to one another; and implanting ions in the semiconductor substrate through the opening in the resist pattern, wherein the step of implanting includes implanting ions at least in the first region at a first angle, and implanting ions only in the second region at a second angle that differs from the first angle.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 1A-1C are layouts of a solid-state image sensor according to embodiments of the present invention.

DESCRIPTION OF THE EMBODIMENTS

Figure 2A:
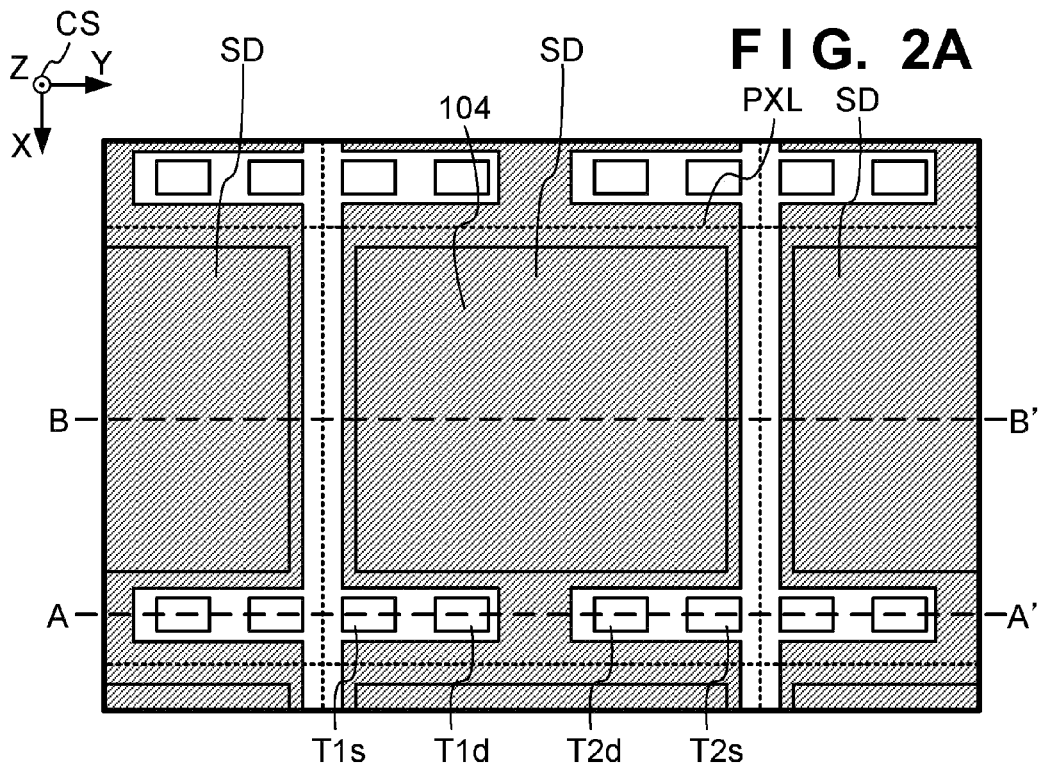
FIGS. 2A-2C are views describing a method of manufacturing a solid-state image sensor according to the first embodiment of the present invention.

Embodiments of the present invention are described below, with reference to the drawings. The same reference numerals are given to similar elements throughout the embodiments. Redundant descriptions are omitted. The present invention can generally be applied to any semiconductor device that has MOS transistors and impurity diffusion layers that isolate elements. A CMOS solid-state image sensor is dealt with below as an example of such a semiconductor device. FIGS. 1A-1C are views of layouts describing one example of configurations of a solid-state image sensor 100 that is manufactured according to a method of manufacturing according to the embodiments of the present invention. FIG. 1A shows a plan view of the solid-state image sensor 100, and FIGS. 1B and 1C are cross-sectional views along lines A-A' and B-B' in FIG. 1A, respectively. Similarly, FIGS. 2A-2C through 8A-8C are plan views and cross-sectional views along lines A-A' and B-B' in the plan views.

The solid-state image sensor 100 may include a pixel array in which pixels are arranged two-dimensionally (i.e., in an array), a row selecting circuit that selects a row in the pixel array, a column selecting circuit that selects a column in the pixel array, and a read circuit that reads a signal from the pixel array via a column signal line. The pixel array, the row selecting circuit, the column selecting circuit, and the read circuit are formed on a semiconductor substrate 101. Typically, the read circuit reads pixel signals selected by the row selecting circuit in the pixel array, and the column selecting circuit selects a signal out of the signals read by the read circuit.

The pixels in the solid-state image sensor 100 may all be constituted alike, and therefore FIGS. 1A-1C show one pixel PXL and portions of the surrounding pixels. The pixel PXL is described. Boundaries between the pixels are indicated by dotted lines in FIGS. 1A-1C for purposes of description. These dotted lines may in some cases not be straight. The semiconductor substrate 101 may include, for example, a semiconductor region 102 and a well region 103 (also called an impurity semiconductor region) disposed thereon. The semiconductor region 102 may be a first conductivity type silicon substrate. The well region 103 may be of the first conductivity type. A first conductivity type accumulation region 104 may be formed in the well region 103. An insulation film 107, being an oxide film or the like, is formed on a surface of the semiconductor substrate 101 (a surface of the well region 103), and a transfer gate 106 is formed on the insulation film 107. If the first conductivity type is an N-type and a second conductivity type is a P-type, then electrons are accumulated in the accumulation region 104, and if the first conductivity type is a P-type and the second conductivity type is an N-type, then holes are accumulated in the accumulation region 104. In the following description, a case is dealt with in which the first conductivity type is an N-type and the second conductivity type is a P-type, but the present invention applies even in the reverse situation.

The pixel PXL has the accumulation region 104, a charge-voltage converter 105 (floating diffusion), and the transfer gate 106. A photoelectric conversion element is formed at least by the accumulation region 104 and the well region 103, and a charge created by the photoelectric conversion element due to incident light to the solid-state image sensor 100 is accumulated in the accumulation region 104 of the photoelectric conversion element. The transfer gate 106 functions as a MOS transistor gate. A MOS transistor channel is formed under the transfer gate 106 due to an active level voltage that is supplied to the transfer gate 106 from the row selecting circuit and the charge accumulated in the accumulation region 104 is transferred to the charge-voltage converter 105 through this channel. A region that includes the region in which this channel is formed, is under the gate, and is between a source and a drain is called a channel region.

The pixel PXL may include one or more MOS transistors that function as a reset switch that resets the voltage of the charge-voltage converter 105, an amplifier that outputs to the column signal line a signal corresponding to the voltage of the charge-voltage converter 105, a selection switch for selecting pixels, and so on. Examples of other MOS transistors include a switch for adding a charge in a photoelectric conversion element and a charge in an adjacent photoelectric conversion element. Of these MOS transistors, one is called a MOS transistor T1 (a first MOS transistor) and another is called a MOS transistor T2 (a second MOS transistor). It does not matter which of the MOS transistors T1 and T2 have which function. In the present embodiment, a case is dealt with in which both MOS transistors T1 and T2 are N-type transistors, but it is also possible for at least one to be a P-type transistor. The MOS transistor T1 may have a source T1$s$ and a drain T1$d$ that are formed in the active region of the well region 103 inside the semiconductor substrate 101, and an ion introduction layer (implantation layer) T1$i$ that is formed in the channel region between the source T1$s$ and the drain T1$d$. The MOS transistor T1 may also have a gate T1$g$ that is formed on the insulation film 107 of the semiconductor substrate 101 so as to cover the channel region. Like the MOS transistor T1, the MOS transistor T2 may have a source T2$s$, a drain T2$d$, an ion introduction layer (implantation layer) T2$i$, and a gate T2$g$. The solid-state image sensor 100 may also have a P-type impurity diffusion layer 112 under the transistors T1 and T2.

In the solid-state image sensor 100, each pixel has the charge-voltage converter 105 and the MOS transistors T1 and T2, but it is also possible for a plurality of pixels to share the charge-voltage converter 105 and the MOS transistors T1 and T2. Furthermore, the solid-state image sensor 100 may have a wiring layer that is connected to the charge-voltage converter 105 and the MOS transistors T1 and T2, but because it is also possible for the wiring layer to have a well-known constitution, a description thereof is omitted, and it is not shown in the drawings.

The solid-state image sensor 100 has a P-type diffusion layer 108 that is formed between the accumulation layer 104 and the insulation film 107 that is formed on the surface of the semiconductor substrate 101. The solid-state image sensor 100 may also have an insulation film 109, being an oxide film or the like, for isolating the MOS transistors T1 and T2 from other elements, and a P-type semiconductor layer 111 that functions as a channel stop, disposed directly under the insulation film 109. The solid-state image sensor 100 may have a P-type impurity diffusion layer 110 that isolates the photoelectric conversion elements of adjacent pixels. The impurity diffusion layer 110 may be disposed between the photoelectric conversion elements of adjacent pixels, and more particularly may be disposed between the accumulation regions 104 of the pixels.

A coordinate system CS as shown in each drawing is established for the sake of the description. In this coordinate system CS, the XY plane is parallel to the surface of the semiconductor substrate 101, and the Z-axis is parallel to the normal of the surface of the semiconductor substrate 101. In the present embodiment, the charge-voltage converter 105 and the MOS transistors T1 and T2 are formed between the accumulation regions 104 of two adjacent pixels in the X-direction, and the impurity diffusion layer 110 is formed between the accumulation regions 104 of two adjacent pixels in the Y-direction, with no other elements being formed therein. In the description below, the range within which the semiconductor region is formed is shown in the drawings, but this is merely a schematic representation.

Figure 2B:
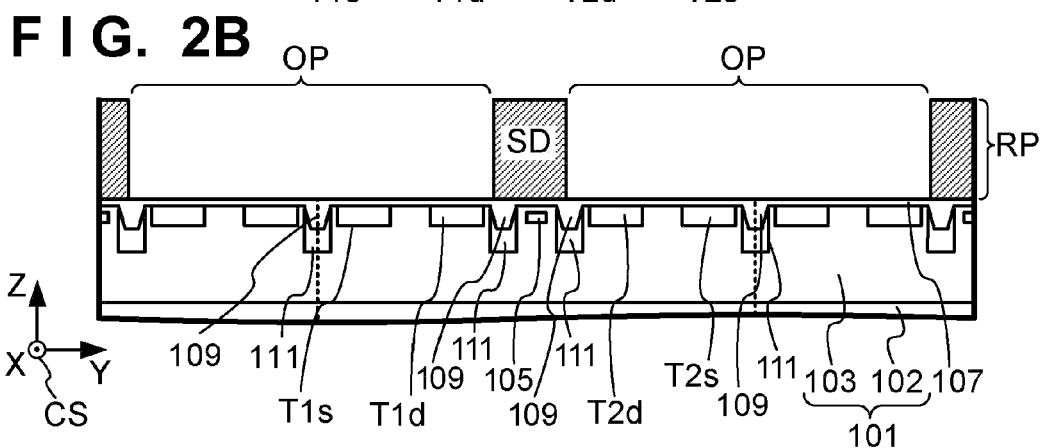
Figure 2C:
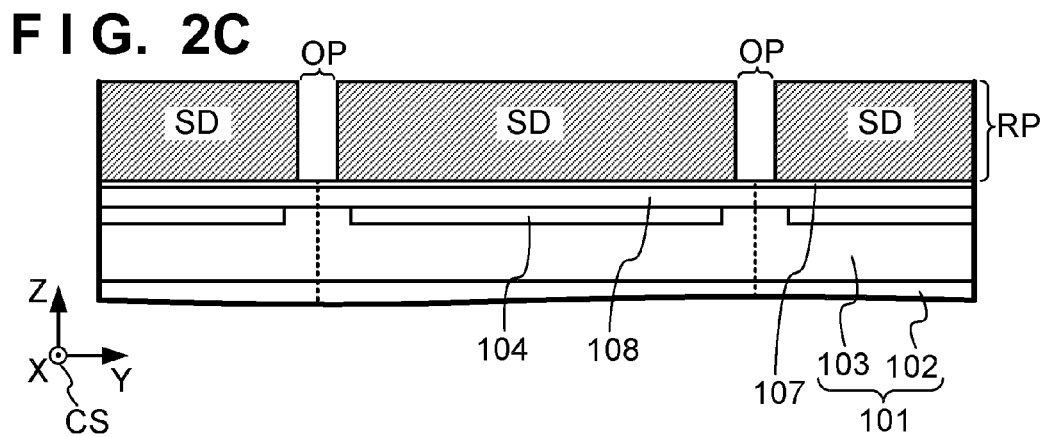

Next, a first embodiment of a method of manufacturing the solid-state image sensor 100 shown in FIGS. 1A-1C is described, with reference to FIGS. 2A-2C through 4A-4C. First, the semiconductor substrate 101 shown in FIGS. 2A-2C is prepared. The well region 103, the charge-voltage converter 105, the insulation films 107 and 109, the semiconductor layer 111, the diffusion layer 108, the sources T1$s$ and T2$s$, and the drains T1$d$ and T2$d$ are formed in the semiconductor substrate 101. The transfer gate 106 and the gates T1$g$ and T2$g$ are formed on the semiconductor substrate 101. In the manufacturing method of the embodiments that follow, the transfer gate 106 and the gates T1$g$ and T2$g$ are omitted from the drawings in order to simplify the description. Well-known techniques may be used for the method of forming the semiconductor substrate 101, and therefore a description thereof is omitted. Next, a resist pattern RP is formed by a photolithography step on the semiconductor substrate 101. The resist pattern RP has an opening OP and a shielding portion SD as shown in FIGS. 2A-2C. In the present embodiment, when the semiconductor substrate 101 is viewed from the direction of the Z-axis, the shielding portion SD of the resist pattern RP covers the accumulation region 104 and the charge-voltage converter 105. Furthermore, when the semiconductor substrate 101 is viewed from the direction of the Z-axis, the channel region of the MOS transistors T1 and T2 (the region between the source and the drain) and the region between the adjacent accumulation regions 104 (hereafter called an isolation region) are exposed in the opening OP in the resist pattern RP.

Figure 3A:
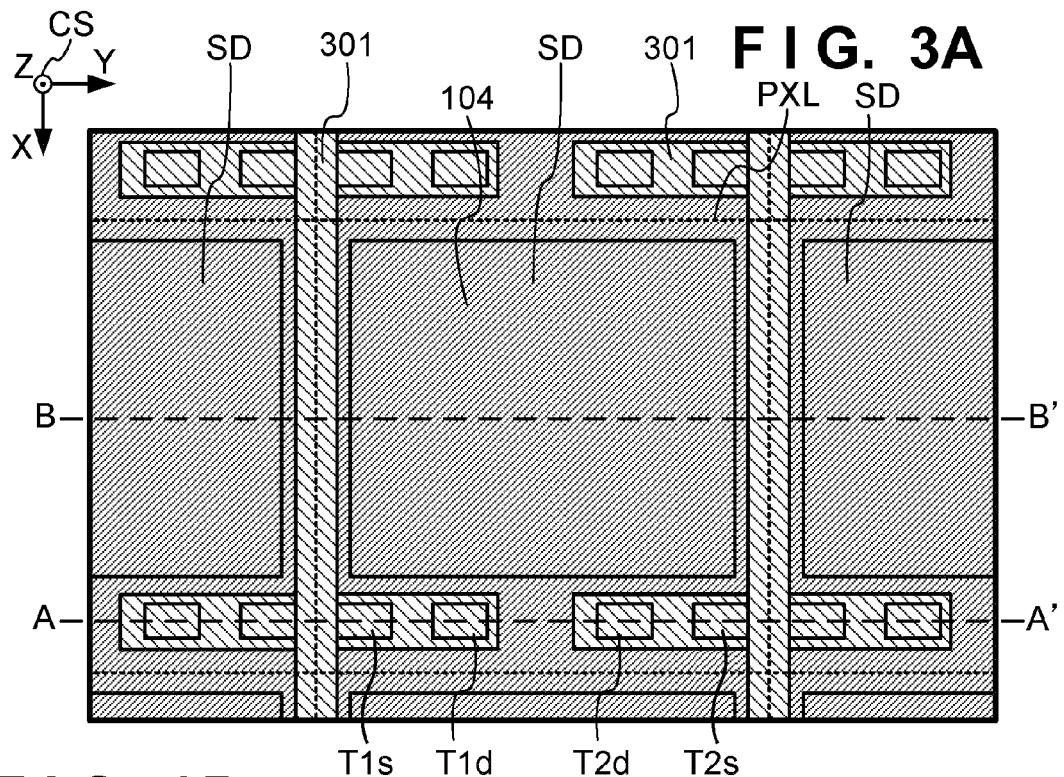
FIGS. 3A-3C are views describing a method of manufacturing a solid-state image sensor according to the first embodiment of the present invention.
Figure 3B:
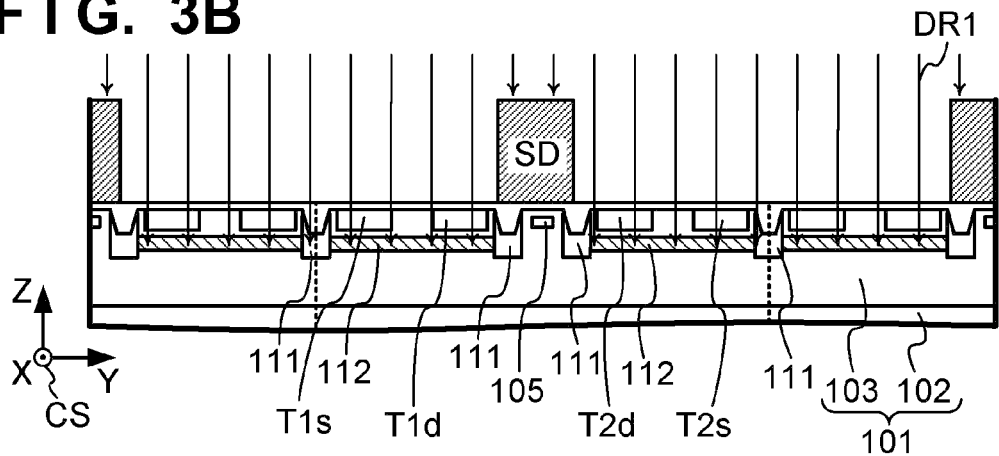
Figure 3C:
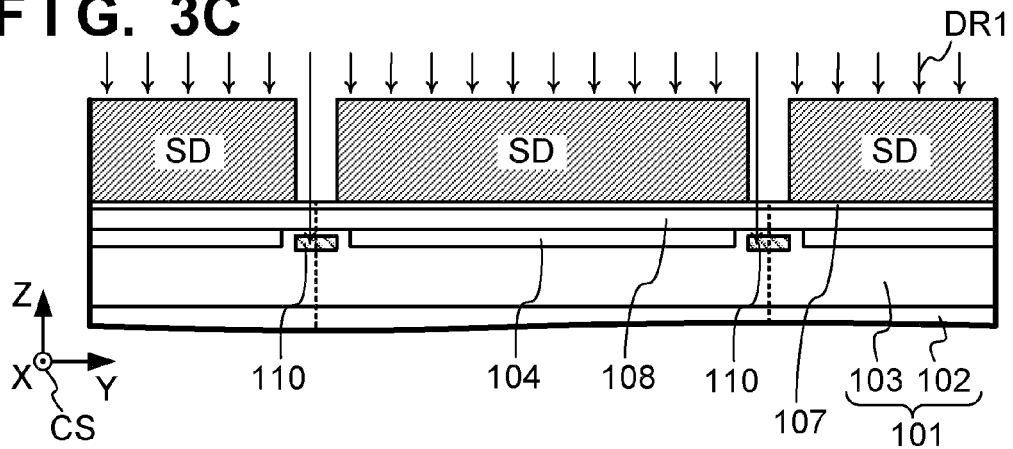

Next, as shown in FIGS. 3A-3C, a step of irradiating (implanting) ions in a direction DR1 (a first direction) that is parallel to the Z-axis, i.e., the direction DR1 that is orthogonal to the surface of the semiconductor substrate 101, is performed. In other words, the ion irradiation direction (implantation direction) is the direction DR1. The direction DR1 in this case is 0° relative to the normal of the surface of the semiconductor substrate. In this specification, directions are defined by spatial vectors in the coordinate system CS. When the semiconductor substrate 101 is viewed from the direction DR1, the shielding portion SD of the resist pattern RP shields the accumulation region 104 and the charge-voltage converter 105, and the isolation region and the region in which the MOS transistors T1 and T2 are formed are exposed in the opening OP of the resist pattern RP. Therefore, ions passing through the opening OP in the resist pattern RP reach those portions of the surface of the semiconductor substrate 101 indicated by the cross-hatching 301 in FIG. 3A and are implanted in the semiconductor substrate 101. The ions that are implanted are, for example, boron or indium ions, for forming P-type semiconductor regions. The ions that are implanted in the isolation region form the P-type impurity diffusion layer 110 in the semiconductor substrate 101. The ions implanted in the region in which the MOS transistors T1 and T2 are formed form the P-type impurity diffusion layer 112 under the sources T1s and T2s and the drains T1d and T2d of these transistors.

Figure 4A:
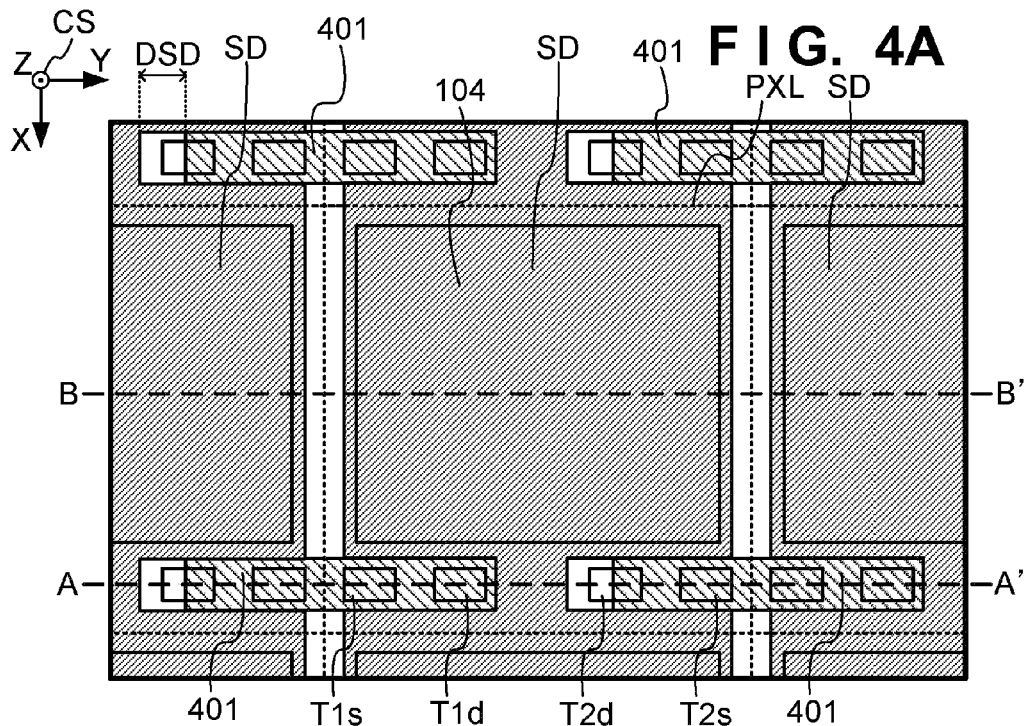
FIGS. 4A-4C are views describing a method of manufacturing a solid-state image sensor according to the first embodiment of the present invention.
Figure 4B:
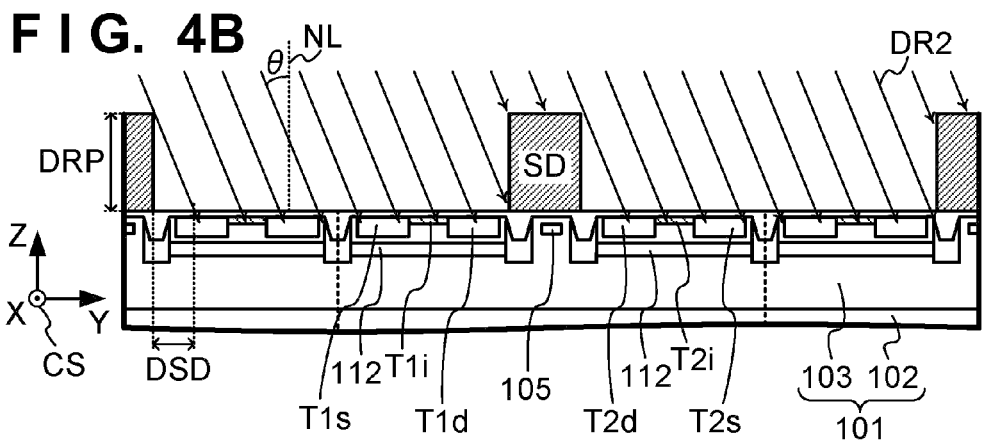
Figure 4C:
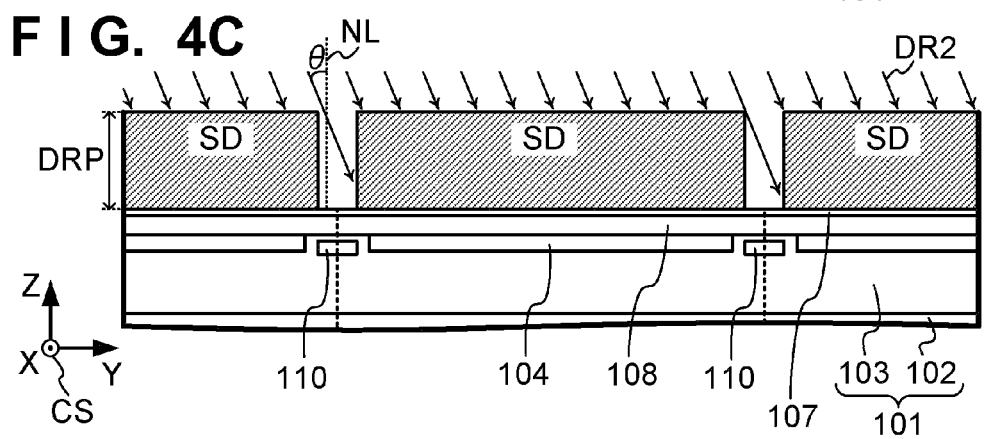

Next, as shown in FIGS. 4A-4C, a step of irradiating (implanting) ions in a direction DR2 (a second direction) that is parallel to the YZ plane and is tilted relative to the Z-axis is performed. In other words, the ion irradiation direction (implantation direction) is the direction DR2. The direction DR2 has an angle θ relative to a normal NL of the surface of the semiconductor substrate. Therefore, ions passing through the opening OP in the resist pattern RP reach those portions of the surface of the semiconductor substrate 101 indicated by the cross-hatching 401 in FIG. 4A and are implanted in the semiconductor substrate 101. Low-dose and low-energy ion implantation is used to control the threshold voltage of the MOS transistors T1 and T2. When the semiconductor substrate 101 is viewed from the direction DR2, the shielding portion SD of the resist pattern RP shields the accumulation region 104, the charge-voltage converter 105, and the isolation region, while the region in which the MOS transistors T1 and T2 are formed is exposed in the opening OP of the resist pattern RP. Therefore, ions that are implanted in the region in which the MOS transistors T1 and T2 are formed form the ion introduction layers T1i and T2i in the channel region of the transistors. On the other hand, ions that are irradiated at the isolation region are blocked by the shielding portion SD of the resist pattern RP and do not reach the semiconductor substrate 101. The resist pattern RP has lateral faces that are perpendicular to the semiconductor substrate, and therefore, assuming DSD is one side of the region thus shielded, a relationship $DSD = \tan\theta \times DRP$ holds, based on a thickness DRP of the resist pattern RP and the angle θ of the ion implantation direction. The thickness DRP of the resist pattern and the angle θ of the ion implantation direction can be set so as to achieve a desired DSD.

Thus when the semiconductor substrate 101 is viewed from the direction DR2, the regions that isolate the accumulation regions 104 which are adjacent are in the shadow of the shielding portion SD of the resist pattern RP. Therefore, ions for controlling the threshold voltage of the MOS transistors T1 and T2 are not introduced into these regions. The impurity diffusion layer 110 isolating the accumulation region 104 can be therefore free from the threshold voltage control ion dose. Moreover, the impurity diffusion layer 112 is formed under the MOS transistors T1 and T2, but the impurity diffusion layer 112 is positioned deeper than the ion introduction layers T1i and T2i and is more concentrated than the well region 103. The impurity diffusion layer 112 can function as a potential barrier between the source and the drain of the N-type MOS transistors T1 and T2. Note that the transfer gate 106 can also be formed after this ion implantation step (irradiation step). The solid-state image sensor 100 of FIGS. 1A-1C is manufactured through the abovementioned steps.

In the CMOS solid-state image sensor of the present embodiment, it is also possible to form the ion introduction layer in the MOS transistor of an amplifier, based on the fact that the threshold of the MOS transistor of the amplifier considerably affects the dynamic range of a signal, noise, and so on. In the present embodiment, the MOS transistor T1 is the MOS transistor of the amplifier, and ions for forming an N-type semiconductor region are implanted to form the N-type ion introduction layer T1i. This is to form the MOS transistor T1 of the amplifier as a burried-channel MOS transistor capable of reducing noise. Furthermore, the MOS transistor T2 is used as a reset switch and ions for forming an N-type semiconductor region are implanted to form the N-type ion introduction layer T2i. The ion introduction layer T2i can be formed as an N-type or a P-type depending on setting of the threshold of the reset switch.

In the above embodiment, using the resist pattern RP, which is common to the two ion implantation steps makes it possible to reduce the number of resist pattern formation and removal steps, thereby making the solid-state image sensor manufacture short and economical. In the above examples, a case was dealt with in which the angle of the direction DR2 relative to the normal of the surface of the semiconductor substrate 101 was greater than that of the direction DR1. However, it is also possible to make the angles thereof equal or to reverse the relationship of size therebetween by adjusting the direction of ion irradiation. For example, it is also possible to implant the ions for forming the impurity diffusion layer 110 described in FIGS. 3A-3C in a direction that is parallel to the XZ plane and tilted relative to the Z-axis. When the semiconductor substrate 101 is viewed from this direction, the shielding portion SD of the resist pattern RP shields the region in which the accumulation region 104, the charge-voltage converter 105, and the MOS transistors T1 and T2 are formed. Moreover, when the semiconductor substrate 101 is viewed from this direction, the isolation region is exposed in the opening OP of the resist pattern RP. Therefore, the impurity diffusion layer 110 is formed, but the impurity diffusion layer 112 that is below the MOS transistors T1 and T2 is not formed.

Figure 5A:
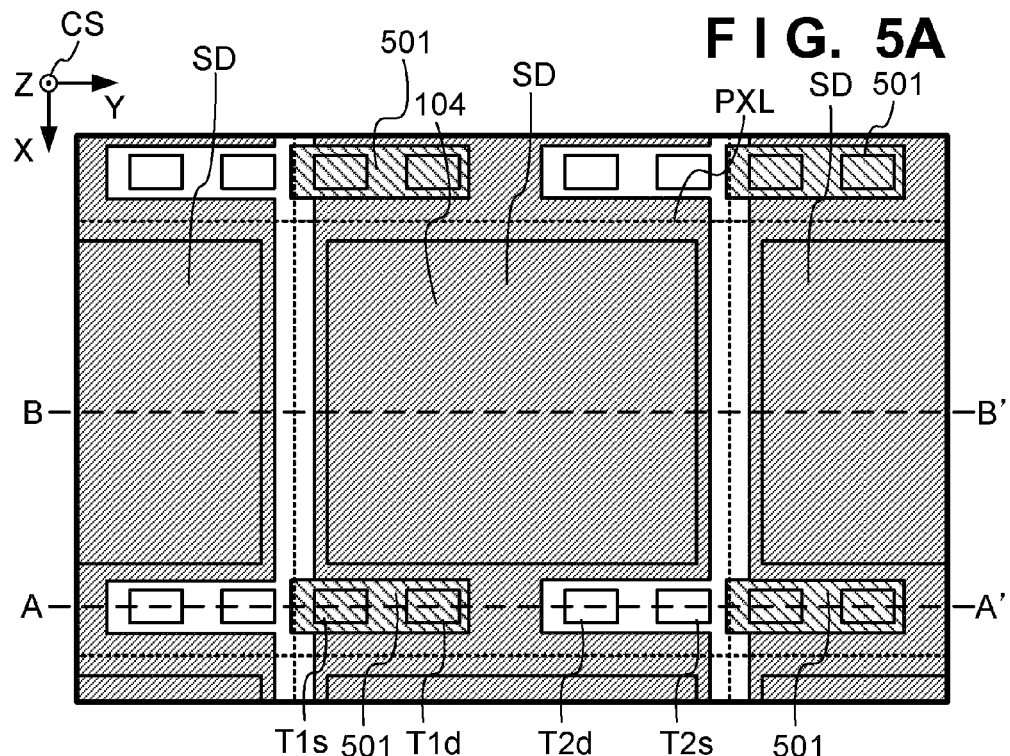
FIGS. 5A-5C are views describing a method of manufacturing a solid-state image sensor according to the second embodiment of the present invention.
Figure 5B:
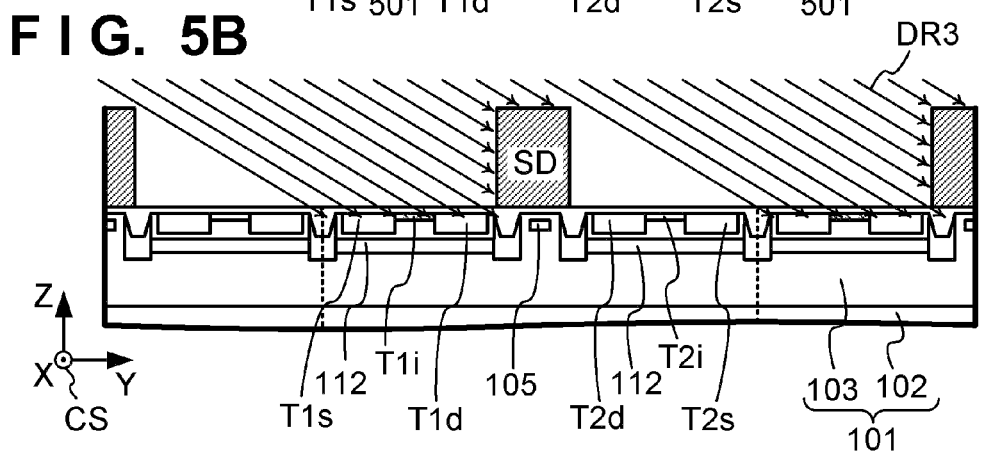
Figure 5C:
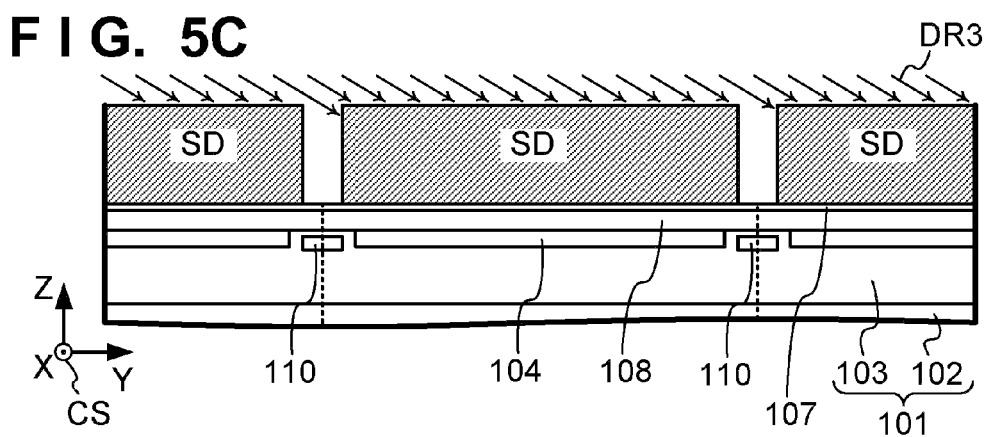

Next, a second embodiment of a method of manufacturing the solid-state image sensor 100 shown in FIGS. 1A-1C is described, with reference to FIGS. 5A-5C. In the second embodiment, everything is the same as in the first embodiment up to the ion implantation step described using FIGS. 4A-4C, but a step of implanting ions from a direction DR3 (a third direction) that is parallel to the YZ plane and tilted relative to the Z-axis is also performed thereafter. The direction DR2 and the direction DR3 are different from one another. In the present embodiment, the angle formed by the normal of the surface of the semiconductor substrate 101 and the direction DR3 is larger than the angle formed by the normal of the surface of the semiconductor substrate 101 and the direction DR2. Here, the angle formed by the normal of the surface and the direction means an angle (90° or less) formed by the normal and a straight line in the direction. Using the angle θ of the ion implantation direction in the first embodiment, an angle $θ_3$ of the third direction and the angle θ of the second direction are in the relationship $θ<θ_3$. Therefore, when the semiconductor substrate 101 is viewed from the direction DR3, the shielding portion SD of the resist pattern RP shields the region in which the accumulation region 104, the charge-voltage converter 105, the isolation region, and the MOS transistor T1 are formed. Moreover, when the semiconductor substrate 101 is viewed from this direction, the region in which the MOS transistor T2 is formed is exposed in the opening OP of the resist pattern RP. Therefore, ions passing through the opening OP in the resist pattern RP reach those portions of the surface of the semiconductor substrate 101 indicated by the cross-hatching 501 in FIG. 5A and are implanted in the semiconductor substrate 101. The concentration of the ion introduction layer T1i of the MOS transistor T1 is increased by these ions. However, because the ions that are implanted in the direction DR3 do not reach the ion introduction layer T2i of the MOS transistor T2, the concentration of the ion introduction layer T2i does not change. Furthermore, ions that are irradiated at the isolation region are blocked by the shielding portion SD of the resist pattern RP and do not reach the semiconductor substrate 101.

If the ion introduction layer T1i needs to be formed in the MOS transistor T1 but the ion introduction layer T2i does not need to be formed in the MOS transistor T2, the desired formation can be performed only by the ion implantation step shown in FIGS. 5A-5C without the additional resist and ion implantation steps.

In the second embodiment, the threshold voltages of the MOS transistors can be made to differ from one another, and therefore the performance of the solid-state image sensor 100 can be improved over the advantages of the first embodiment.

Figure 6A:
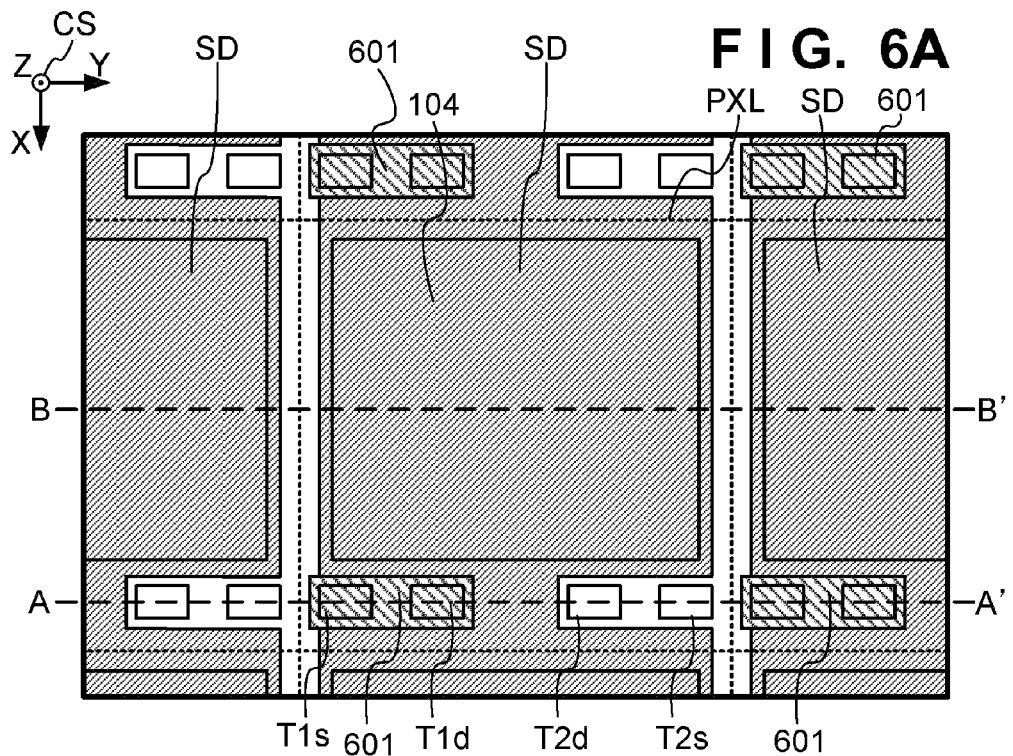
FIGS. 6A-6C are views describing a method of manufacturing a solid-state image sensor according to the third embodiment of the present invention.
Figure 6B:
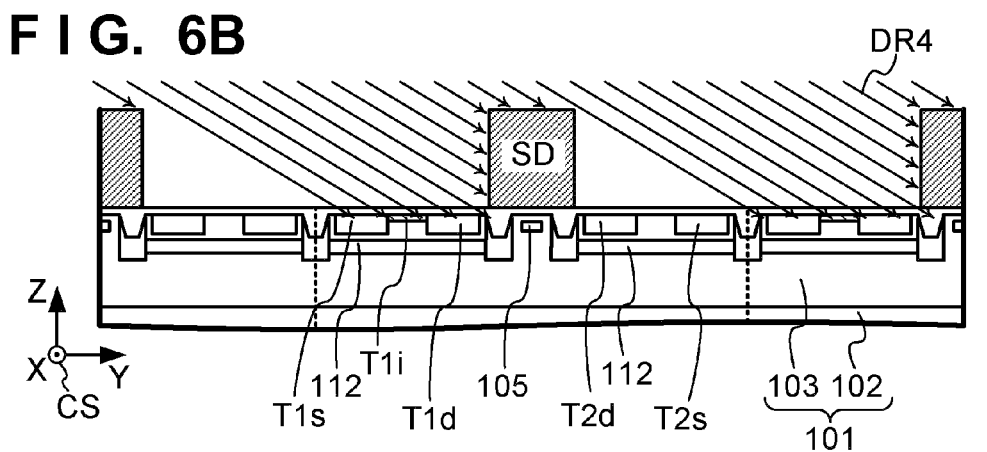
Figure 6C:
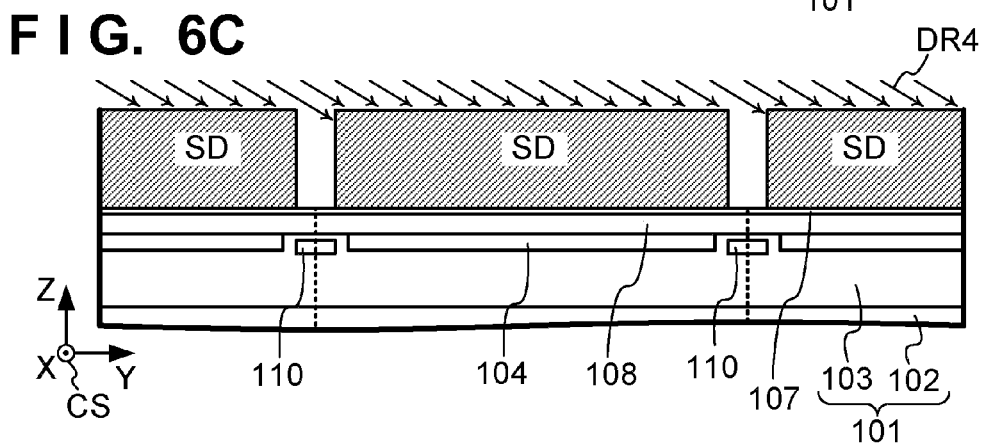
Figure 7A:
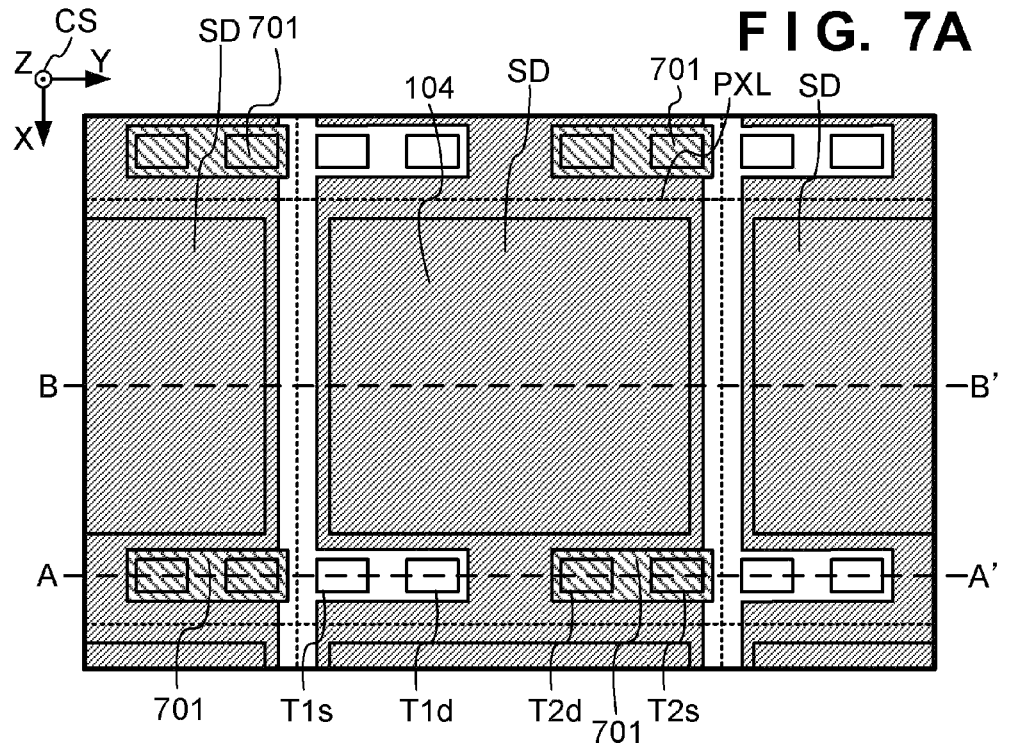
FIGS. 7A-7C are views describing a method of manufacturing a solid-state image sensor according to the third embodiment of the present invention.
Figure 7B:
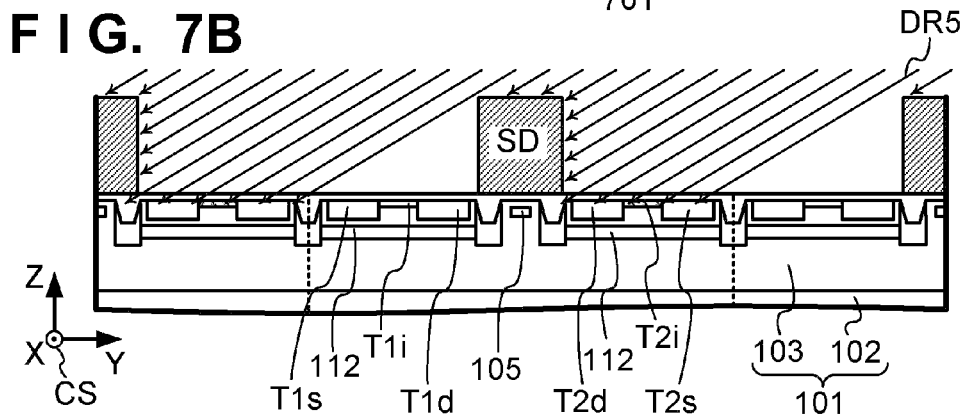
Figure 7C:
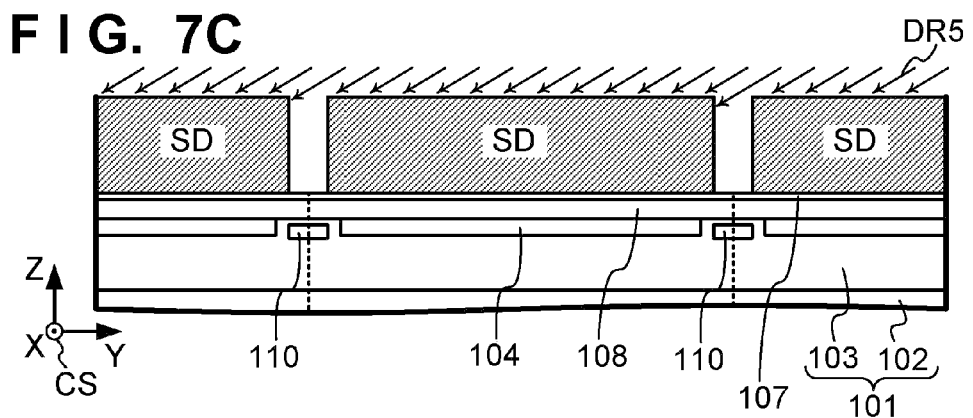

Next, a third embodiment of a method of manufacturing the solid-state image sensor 100 shown in FIGS. 1A-1C is described, with reference to FIGS. 6A-6C through 7A-7C. In the third embodiment, everything is the same as in the first embodiment up to the ion implantation step described using FIGS. 3A-3C. A step of implanting ions in a direction DR4 that is parallel to the YZ plane and tilted relative to the Z-axis, as shown in FIGS. 6A-6C, and a step of implanting ions in a direction DR5 that is tilted relative to the Z-axis, as shown in FIGS. 7A-7C, are performed thereafter. In the present embodiment, because the direction DR4 (the second direction) and the direction DR5 (the third direction) are the same angle relative to the semiconductor substrate 101, they are symmetrical relative to the YZ plane.

As shown in FIGS. 6A-6C, when the semiconductor substrate 101 is viewed from the direction DR4, the shielding portion SD of the resist pattern RP shields the region in which the accumulation region 104, the charge-voltage converter 105, the isolation region, and the MOS transistor T1 are formed. When the semiconductor substrate 101 is viewed from the direction DR4, the region in which the MOS transistor T2 is formed is exposed in the opening OP of the resist pattern RP. Therefore, ions irradiated in the direction DR4 and passing through the opening OP in the resist pattern RP reach those portions of the surface of the semiconductor substrate 101 indicated by the cross-hatching 601 in FIG. 6A and are implanted in the semiconductor substrate 101. The ion introduction layer T1i is formed in the channel region of the MOS transistor T1 by these ions. Ions implanted in the direction DR4 do not, however, reach the channel region of the MOS transistor T2, and therefore the ion introduction layer T2i is not formed in this step.

As shown in FIGS. 7A-7C, when the semiconductor substrate 101 is viewed from the direction DR5, the shielding portion SD of the resist pattern RP shields the region in which the accumulation region 104, the charge-voltage converter 105, the isolation region, and the MOS transistor T2 are formed. When the semiconductor substrate 101 is viewed from the direction DR5, the region in which the MOS transistor T1 is formed is exposed in the opening OP of the resist pattern RP. Therefore, ions irradiated in the direction DR5 and passing through the opening OP in the resist pattern RP reach those portions of the surface of the semiconductor substrate 101 indicated by the cross-hatching 701 in FIG. 7A and are implanted in the semiconductor substrate 101. The ion introduction layer T2i is formed in the channel region of the MOS transistor T2 by these ions. Ions implanted in the direction DR5 do not, however, reach the channel region of the MOS transistor T1, and therefore the concentration of the ion introduction layer T1i does not change in this step.

In both of the ion implantation steps in FIGS. 6A-6C and 7A-7C, the ions implanted through the opening OP in which the area between the accumulation regions 104 of adjacent pixels is exposed are blocked by the shielding portion SD of the resist pattern RP and do not reach the semiconductor substrate 101.

Furthermore, if an ion introduction layer is to be formed in only one or the other of the MOS transistors T1 and T2, only the ion implantation step of FIGS. 6A-6C or the ion implantation step of FIGS. 7A-7C need be performed.

In the third embodiment the threshold voltages of the plurality of MOS transistors can be controlled independently, increasing the freedom of controlling the threshold voltages of the MOS transistors, in addition to the advantages of the first embodiment and the second embodiment. For example, different types of ions can be used to adjust the threshold voltages of the MOS transistors.

Figure 8A:
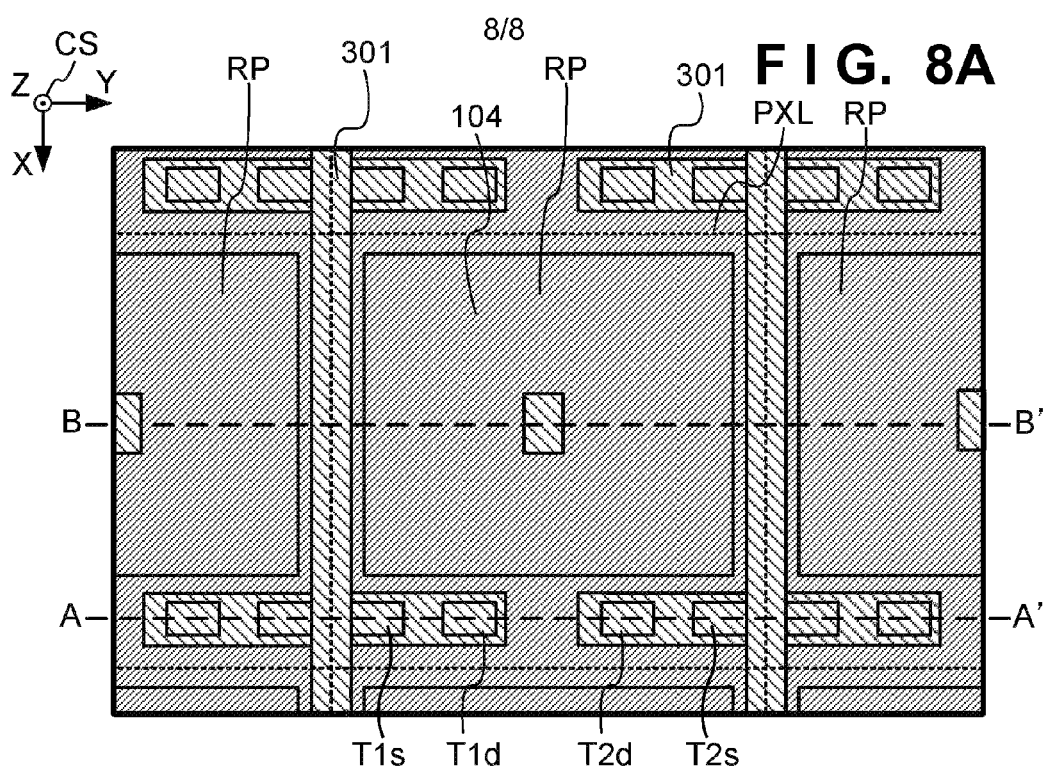
FIGS. 8A-8C are views describing a variation of a method of manufacturing a solid-state image sensor according to the first embodiment of the present invention.
Figure 8B:
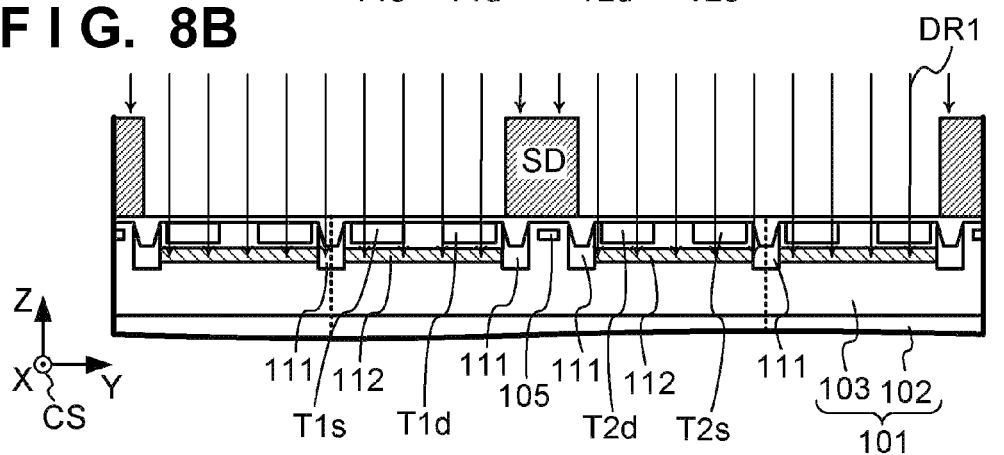
Figure 8C:
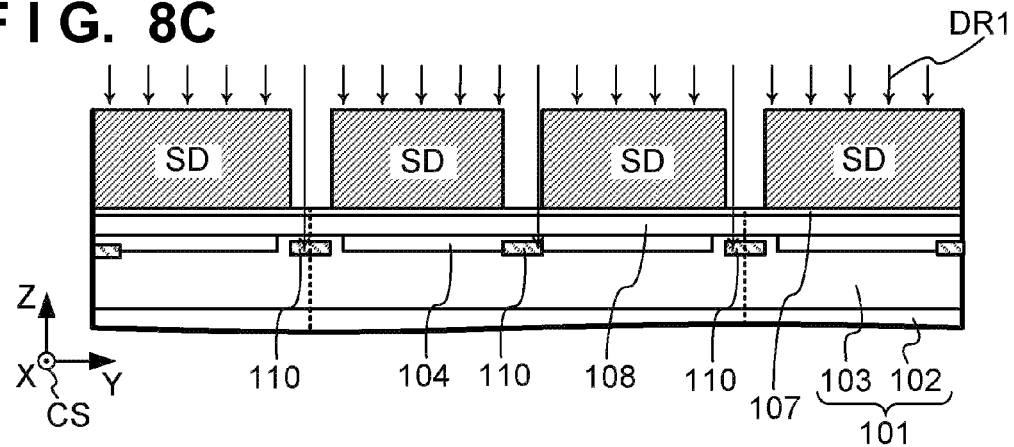

Next, a variation of the above embodiments is described, with reference to FIGS. 8A-8C. A case will be described in which a variation is applied to the first embodiment, but this variation can be applied to the second embodiment or the third embodiment as well. In this variation, a central portion of the accumulation region 104 is exposed even more in the opening OP of the resist pattern RP. The P-type impurity diffusion layer 110 is thereby also formed in the center portion of the accumulation region 104 in the ion implantation step of FIGS. 3A-3C. The transfer efficiency of transferring the charge accumulated in the N-type accumulation region 104 to the charge-voltage converter 105 can thereby be improved. A size of the opening OP where this interior area is opened can be formed so as to prevent ions reaching it in the ion implantation step of FIGS. 4A-4C. Therefore, the impurity diffusion layer 110 formed inside the accumulation region 104 is free from the ion implantation for controlling the threshold voltage of the MOS transistor.

The above embodiments have been described only in reference to the constitution of a pixel, but they can also be applied to transistors in circuits such as read circuits. Furthermore, a method of controlling the threshold voltages of two MOS transistors was described in the above embodiments, but it is also possible to adjust the threshold voltages of three or more MOS transistors by adjusting the thickness of the resist pattern, the position and size of the opening, and the direction of introduction of ions. The embodiments can also be combined. Furthermore, a CMOS solid-state image sensor was described as an example above, but the present invention can also be applied to other aspects of a solid-state image sensor. For example, the present invention can also be applied to a semiconductor device such as a storage device which has an impurity diffusion layer that isolates a signal holding portion of a memory cell that has a MOS transistor, and an ion introduction layer that controls the threshold voltage of the MOS transistor. Moreover, the plurality of ion implantation steps in the above embodiments may be performed in a different order after being performed in the order described above, or may be performed concurrently. When performing the ion implantation steps concurrently, for example, an ion implantation device is to be prepared which has two systems of ion implantation mechanisms, each including an ion source that generates ions, a beam line that transports the ions, and an accelerating tube that accelerates the ions. The ion implantation step may be accompanied by an annealing step.

With the method of manufacturing a semiconductor device of the present invention, two semiconductor regions can be separately made by performing a step of implanting ions at least twice from different directions, using a resist pattern that has openings in which at least the two regions are exposed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent No. 2011-223457, filed Oct. 7, 2011, which is hereby incorporated by reference herein in its entirety.

What is claimed is:

1. A method of manufacturing a solid-state image sensor in which a plurality of photoelectric conversion elements, each including an accumulation region in which a charge accumulates, and one or more MOS transistors are formed on a semiconductor substrate, the method comprising:
   forming a resist pattern having an opening and a shielding portion over the semiconductor substrate; and
   implanting ions in the semiconductor substrate through the opening in the resist pattern,
   wherein during the step of forming, the resist pattern is formed such that
   when the semiconductor substrate is viewed from a first direction, an isolation region that is positioned between accumulation regions adjacent to one another is exposed in the opening, and
   when the semiconductor substrate is viewed from a different direction than the first direction, a channel region of the one or more of the MOS transistors is exposed in the opening, and the isolation region is shielded by the shielding portion, and
   during the step of implanting,
   ions irradiated in the first direction are implanted in the semiconductor substrate through the opening in the resist pattern for forming the isolation region, and
   ions irradiated in the different direction are implanted in the semiconductor substrate through the opening in the resist pattern for forming the channel region of the one or more MOS transistors.

2. The method as claimed in claim 1,
   wherein an angle of the different direction relative to the normal of a surface of the semiconductor substrate is greater than that of the first direction.

3. The method as claimed in claim 1,
   wherein, during the step of implanting, ions are irradiated such that the ions implanted in the isolation region are positioned deeper from the surface of the semiconductor substrate than the ions implanted in the channel region of the one or more MOS transistors.

4. The method as claimed in claim 1,
   wherein the accumulation region is of a first conductivity type, and the ions irradiated in the different direction are ions for forming a semiconductor region of the first conductivity type.

5. The method as claimed in claim 1,
   wherein the one or more MOS transistors include a first MOS transistor and a second MOS transistor, and
   the different direction includes a second direction and a third direction that are different from one another, and
   during the step of forming, the resist pattern is formed such that
   when the semiconductor substrate is viewed from the second direction, a channel region of the first MOS transistor is exposed in the opening, and
   when the semiconductor substrate is viewed from the third direction, a channel region of the second MOS transistor is exposed in the opening, and the channel region of the first MOS transistor is shielded by the shielding portion, and
   during the step of implanting,
   ions irradiated in the second direction are implanted in the channel region of the first MOS transistor, and
   ions irradiated in the third direction are implanted in the channel region of the second MOS transistor.

6. The method as claimed in claim 5,
   wherein during the step of forming, the resist pattern is formed such that when the semiconductor substrate is viewed from the second direction, the channel region of the second MOS transistor is shielded by the shielding portion.

7. The method as claimed in claim 1,
   wherein during the step of forming, the resist pattern is formed such that
   when the semiconductor substrate is viewed from the first direction, a central portion of the accumulation region is exposed in the opening, and
   when the semiconductor substrate is viewed from the different direction, the central portion is shielded by the shielding portion, and
   during the step of implanting,
   ions irradiated in the first direction are implanted in the central portion.

8. A method of manufacturing a solid-state image sensor in which a plurality of photoelectric conversion elements, each including an accumulation region in which a charge accumulates, and a MOS transistor are formed on a semiconductor substrate, the method comprising:
   forming, over the semiconductor substrate, a resist pattern having an opening in which are exposed a first region including a channel region of the MOS transistor and a second region that is a region different from the first region and includes an isolation region positioned between accumulation region adjacent to one another; and
   implanting ions in the semiconductor substrate through the opening in the resist pattern,
   wherein the step of implanting includes
   implanting ions through the opening in the resist pattern at least in the first region at a first angle, and
   implanting ions through the opening in the resist pattern only in the second region at a second angle that differs from the first angle.

9. A method of manufacturing a solid-state image sensor including a photoelectric conversion element including an semiconductor region, an isolation region positioned adjacent to the semiconductor region of the photoelectric conversion element, and a MOS transistor, the method comprising:

forming a resist pattern having an opening and a shielding portion over the semiconductor substrate, the opening exposing a first region and a second region of the semiconductor substrate;

forming the isolation region in the first region by implanting ions at a first angle at least in the first region of the semiconductor substrate through the opening in the resist pattern, and forming a channel region of the MOS transistor in the second region by implanting ions at a second angle different from the first angle only in the second region of the semiconductor substrate through the opening in the resist pattern.

* * * * *